United States Patent
Amiya et al.

(10) Patent No.: US 6,484,291 B1
(45) Date of Patent: Nov. 19, 2002

(54) LIBRARY FOR STORING PATTERN SHAPE OF CONNECTING TERMINAL AND SEMICONDUCTOR CIRCUIT DESIGNED WITH DIFFERENT DESIGN RULES

(75) Inventors: Michihiro Amiya; Akihiro Nakamura, both of Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/559,324

(22) Filed: Apr. 27, 2000

Related U.S. Application Data

(62) Division of application No. 09/090,255, filed on Jun. 4, 1998, now Pat. No. 6,127,208.

(30) Foreign Application Priority Data

Aug. 27, 1997 (JP) .............................................. 9-246179

(51) Int. Cl.⁷ ........................... H01L 21/82; G06F 17/50

(52) U.S. Cl. .......................................... 716/1; 438/129

(58) Field of Search ................................ 438/129, 130, 438/598, 599, 666; 716/1, 4, 5, 8, 9, 10, 11, 17

(56) References Cited

U.S. PATENT DOCUMENTS

| | | | | |
|---|---|---|---|---|
| 4,742,019 A | * | 5/1988 | Bechade | 437/48 |
| 5,171,701 A | * | 12/1992 | Nagamatsu | 437/51 |
| 5,292,687 A | * | 3/1994 | Isozaki | 437/209 |
| 5,498,579 A | * | 3/1996 | Borodovsky et al. | 437/250 |
| 5,556,805 A | * | 9/1996 | Tanizawa et al. | 437/195 |
| 5,565,386 A | * | 10/1996 | Bearden et al. | 437/209 |
| 5,741,730 A | * | 4/1998 | Tseng et al. | 438/130 |
| 5,828,102 A | * | 10/1998 | Bergemont | 257/342 |
| 5,831,867 A | * | 11/1998 | Aji et al. | 364/489 |
| 6,127,208 A | * | 10/2000 | Amiya et al. | 438/129 |

* cited by examiner

Primary Examiner—Matthew Smith
Assistant Examiner—Leigh Marie Garbowski
(74) Attorney, Agent, or Firm—Rabin & Berdo, P.C.

(57) ABSTRACT

A library used for manufacturing a semiconductor IC and a method of manufacturing the semiconductor IC. The library includes structures designed with a predetermined design rule. The library has a main part including one or more circuit elements, and a connecting terminal connected to the main part. The connecting terminal has a width less than a minimum space between the conductive patterns of the predetermined design rule. The library further includes a head portion connected to the connecting terminal at an end thereof. A width of the head portion is greater than the minimum space between the conductive patterns of the predetermined design rule.

20 Claims, 5 Drawing Sheets

LIBRARY FOR STORING PATTERN SHAPE OF CONNECTING TERMINAL AND SEMICONDUCTOR CIRCUIT DESIGNED WITH DIFFERENT DESIGN RULES

This application is a division of Ser. No. 09/090,255 filed Jun. 4, 1998 now patented U.S. Pat. No. 6,127,208.

BACKGROUND OF THE INVENTION

The present invention relates to a pattern shape of a connecting terminal stored as a library. The pattern shape is suitable for use in pattern layout with an automatic conductive pattern layout machine (Computer-aided design: CAD), one of semiconductor IC design processes.

A semiconductor IC is manufactured, based upon a pattern layout design, in which information regarding the combination and disposition of logic circuits is included. The pattern layout design is conducted utilizing the automatic conductive pattern layout machine that is operated by an automatic conductive pattern layout program. The automatic conductive pattern layout machine stores a library that is an aggregation of structures of a pad, an I/O cell, an inverter, a NOR circuit and so on formed with a predetermined design rule. A desired structure is read out from the library onto the screen of the automatic conductive pattern layout machine to determine a suitable layout of the structures and conductive patterns connecting the structures.

Each structure is formed according to standard requirements of a minimum space between the conductive patterns and a minimum conductive pattern width determined by the predetermined design rule. Each structure has a connecting terminal having the minimum conductive pattern width. The structures are read out from the library onto the screen having grids aligned at intervals according to the minimum space between the conductive patterns of the automatic conductive pattern layout machine. The structures are located at positions corresponding to the grids. Therefore, a library of structures formed according to a one micron design rule, for example, can be used on the screen to make a new pattern layout according to the one micron design rule without any problems, because the same minimum spaces is provided between the conductive patterns.

However, where the structure designed with according to the one rule is read out to the screen having grids at intervals of 0.8 micron, for example, for the design of an IC device of higher integration, the structure does not match to the grids. Therefore, the conductive pattern may not be located at the position of the connecting terminal of the structure. In such a case, the conductive pattern cannot connect the structures because of the narrower minimum conductive pattern width. A library under the prior art is not flexible and not efficient, requiring a new library for a new design rule.

SUMMARY OF THE INVENTION

It is an object of this invention to provide a library with broader flexibility, enabling the library formed according to a (preset) design rule to be used on a finer design rule.

In order to accomplish the foregoing object, the present invention adopts the following new structure. A library according to the present invention includes structures designed with a predetermined design rule. The library has a main part including one or more circuit elements, and a connecting terminal connected to the main part. The connecting terminal has a width less than a minimum space between the conductive patterns of the predetermined design rule. The library further includes a head portion connected to the connecting terminal at the end thereof. A width of the head portion is greater than the minimum space between the conductive patterns of the predetermined design rule.

DETAILED DESCRIPTION OF THE PREFERRED EMBODIMENTS

Figure 1:
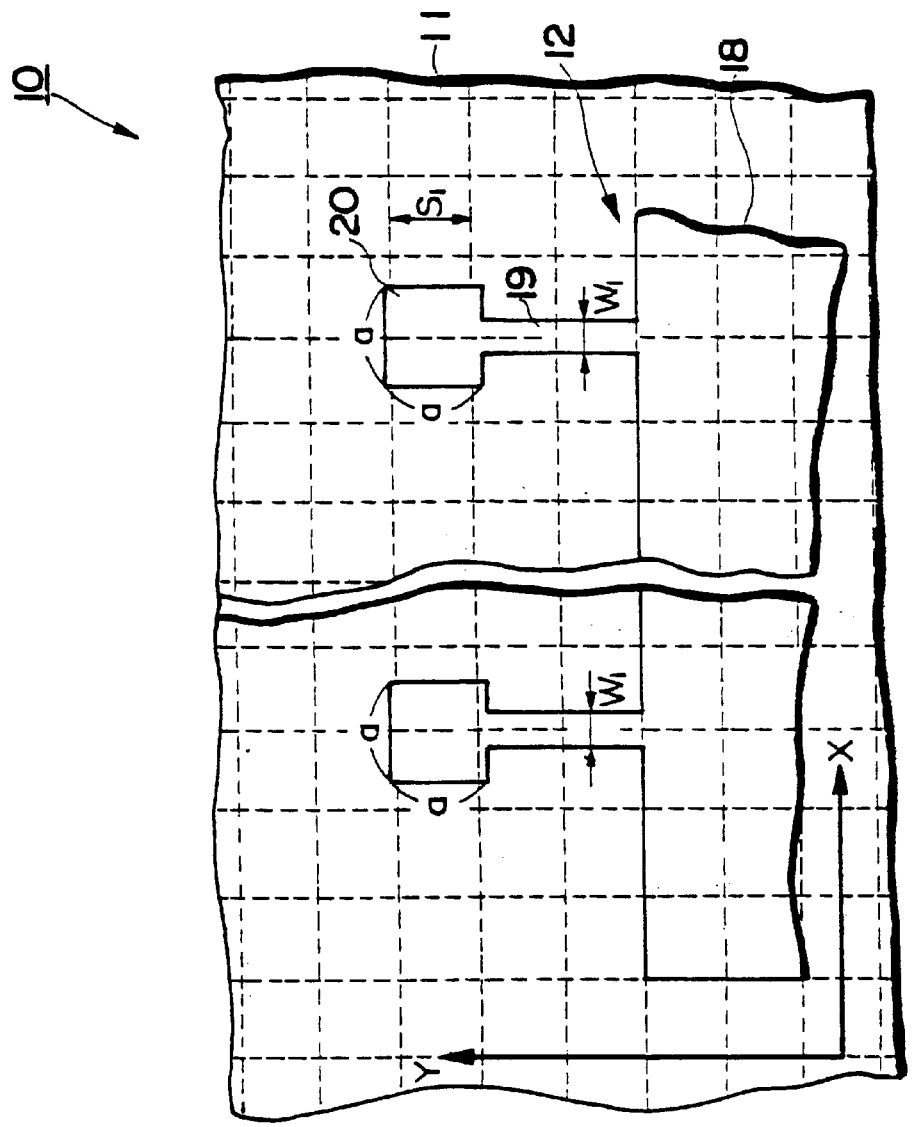
FIG. 1 is a schematic plane view showing a part of a structure according to the first embodiment of the present invention.
Figure 6:
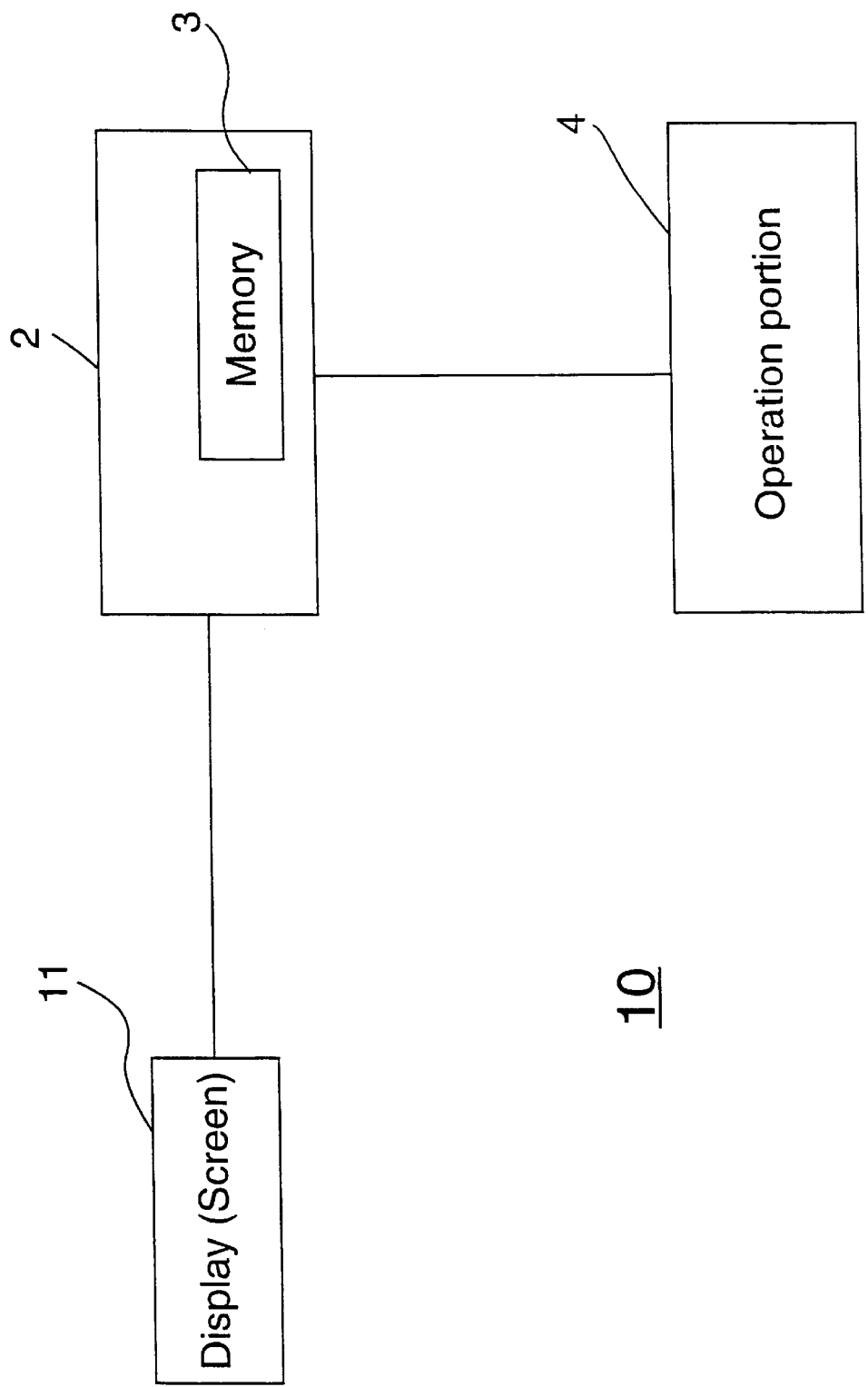
FIG. 6 is a block diagram of an automatic conductive pattern layout machine.

FIG. 1 is a schematic plan view showing a part of the structure 12 of the present invention, shown on the screen 11 of an automatic conductive pattern layout machine 10. FIG. 6 shows a block diagram of the automatic conductive pattern layout machine 10. The automatic conductive pattern layout machine 10 includes a display 1 including the screen 11 (not shown in FIG. 6), a main body 2 of the layout machine 10 including a memory 3 for storing the structure 12 and the library and an operation portion 4. Before an explanation as provided of the structure 12 shown in FIG. 1, an example of a semiconductor IC is explained with reference to FIG. 2.

Figure 2:
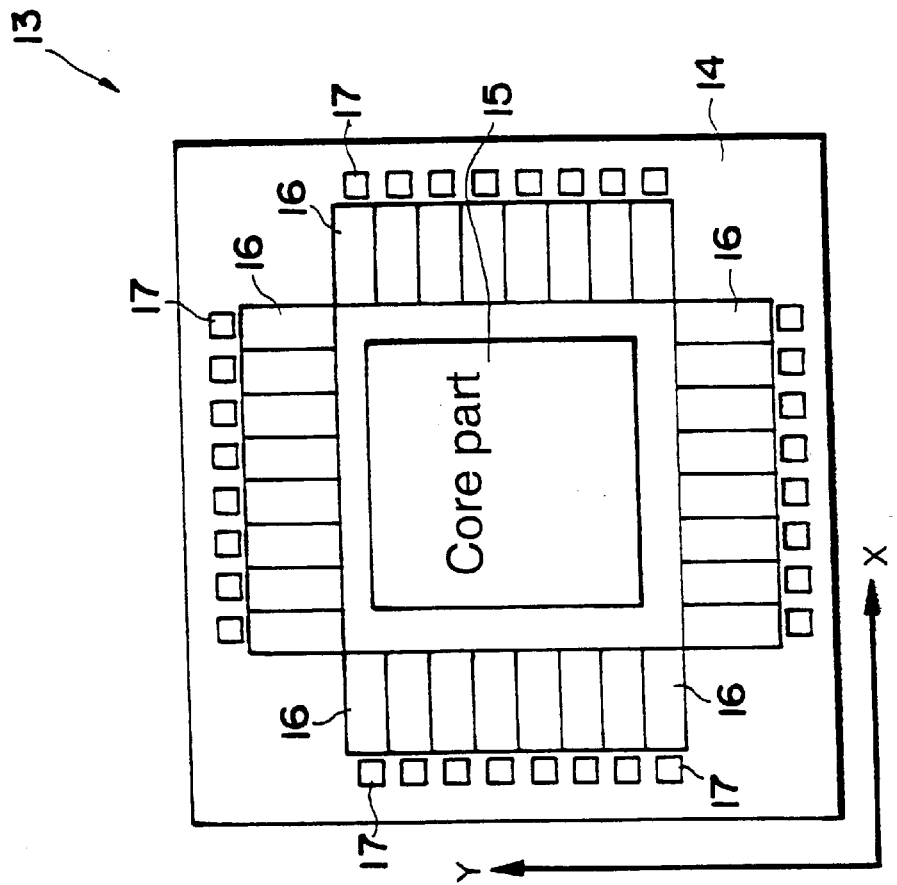
FIG. 2 is a block diagram showing a semiconductor IC, to which the present invention is applicable.

FIG. 2 is a block diagram showing the semiconductor IC 13 including circuits thereof. The positioning of the circuits is determined using a library or a mass of the structures 12 embodying the present invention. As shown in FIG. 2, a core part 15 is disposed in the center of a semiconductor IC chip 14 in the shape of square. Many circuits having major functions of the semiconductor IC are concentrated in a core part 15. A number of I/O cells 16 are disposed in the peripheral area of the core part 15 spaced from the core part 15. Further, a number of pads 17 corresponding to the I/O cells are disposed outside the I/O cells 16. The pads 17 are provided with connecting pins as I/O terminals of the semiconductor IC 13, not shown in FIG. 2. Each connecting pin is connected to a designated part of the circuits disposed in the core part 15 through the corresponding pad 17 and I/O cell 16.

The library, a mass of the structures 12 of the present invention, is used in the automatic conductive pattern layout machine, to determine layout of elements and conductive patterns connecting between the elements. In the present invention, elements may include inverters and logic circuits such as NOR circuits formed in the core part 15, the I/O cells 16 and the pads 17 of the semiconductor IC 13.

The structure 12 shown in FIG. 1 represents, for example, the I/O cell 16. In FIG. 1, grids each having an interval corresponding to the minimum space between the conductive patterns S1, for example 1 micron are indicated on the screen 11 of the automatic conductive pattern layout machine 10. The structure 12 shown in FIG. 1 is designed according to the design rule corresponding to the grids. Therefore, the outline of a main part 18 of the structure 12 is aligned just on the grid, and center lines of two connecting terminals 19 are also aligned on the grids, extending, in parallel to each other, in the Y direction of the screen 11. The main part may include elements such as inverters and logic circuits.

Each connecting terminal 19 has a width that is equal to the minimum conductive pattern width W1 of the design rule and extends from the main part 18 in the Y direction. Each connecting terminal 19 includes a head portion 20. The head portion 20 has, for example, as shown in FIG. 1, the shape of a square with sides extending in the X direction and the Y direction. At least one of dimension a of each side of the head portion exceeds the minimum space between the conductive patterns S1 which minimum space is equal to the intervals of the grids. The purpose of the head portion 20 is to increase the contact area with a conductive pattern described below when the structure 12 is used on the finer design rule. In order to increase the contact area, it is desirable that the dimension a of the sides of the head portion 20 exceeds the total of the minimum space between the conductive patterns S1, i.e., intervals of the grids and the minimum conductive pattern width W1.

Figure 3:
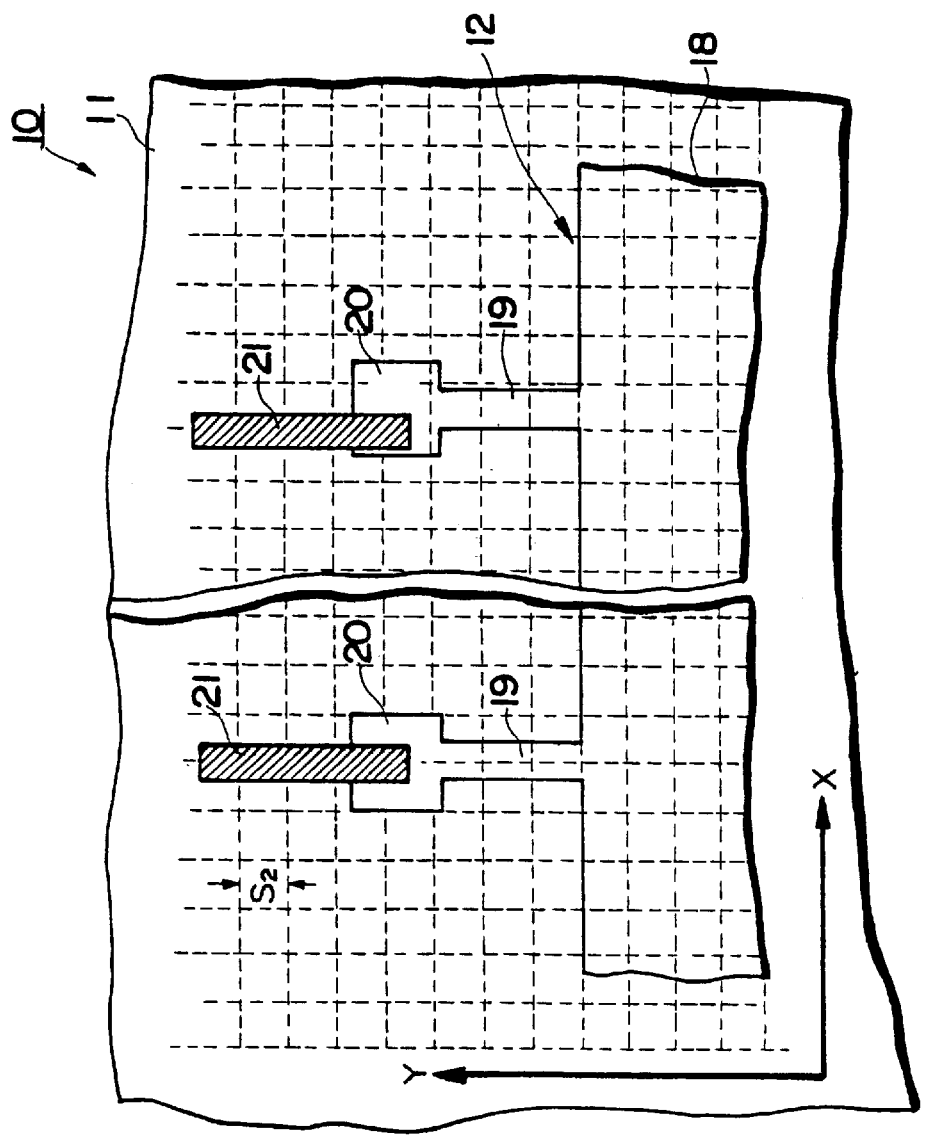
FIG. 3 is a schematic plane view showing a conductive pattern and the structure shown in FIG. 1.

In FIG. 3, the structure 12 designed with a one micron ("the original structure") is read out to the screen 11 of the other automatic conductive pattern layout machine 10, that has grids at intervals of 0.8 micron. In this case, the interval S2 of the grids of the other automatic conductive pattern layout machine is finer than the interval S1 of the grids of the original automatic conductive pattern layout machine by which the original structure is designed. Therefore, at least one of the two connecting terminals 19 of the original structure is positioned with a gap from the grids, where the original structure is read out to the screen of the grid space S2 as shown in FIG. 3, while both of the connecting terminals 19 of the original structure are positioned just on the grids of the screen 11 of the original automatic conductive pattern layout machine, as shown in FIG. 1. Conductive patterns 21 designed with the 0.8 micron design rule can only be disposed just on the grids of the screen 11. That is, the conductive patterns 21 can not be disposed at a position out of the grids, such as between the grids. Therefore, unless the connecting terminal 19 has the head portion 20, sufficient contact area necessary to secure certain electrical contact between the connecting terminal 19 and the conductive pattern 21 may not be obtained.

The structure 12 according to the present invention, however, has the head portion 20 to increase the contact area with the conductive pattern 21. Therefore, as shown in the right connecting terminal 19 in FIG. 3, the conductive pattern 21 can certainly be connected to the connecting terminal 19 through the head portion 20, even if the terminal 19 is disposed out of the grids in the X direction and/or the Y direction. Thus, the structure 12 according to the present invention, even if it is designed with the predetermined design rule, can be used on any design rule. A library that includes the structures according to the present invention, can be used widely, be improved in its efficiency and improve the working efficiency of layout design process.

Figure 4:
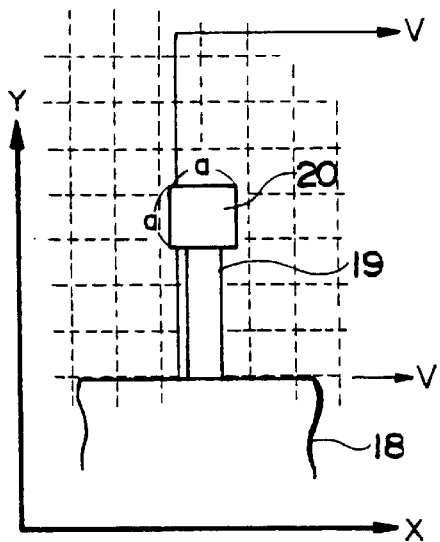
FIG. 4 is a schematic plane view showing a part of the structure according to the second embodiment of the present invention.
Figure 5:
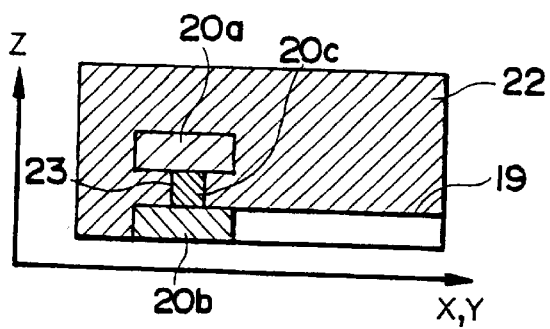
FIG. 5 is a cross sectional view taken along the line V—V of FIG. 4.

FIGS. 4 and 5 show an example of the structure 12 according to the second embodiment of the present invention, applicable to a multi-layer conductive pattern. As shown in FIG. 4, the structure 12 of the second embodiment includes a head portion 20 in the shape of a square having dimension similar to those of the first embodiment, at the end of a terminal 19 extending from a main part 18 similar to the first embodiment. The head portion 20 of the second embodiment has, as shown in FIG. 5, an upper layer part 20a and a lower layer part 20b, which have the same square shape, and are separated by the insulating material (or layer) 22. The lower layer part 20b is formed at the end of the connecting terminal 19 in the same manner as described in the first embodiment. The upper layer part 20a is electrically connected to the lower layer part 20b through a connecting part 20c placed in a through-hole 23 formed in insulating layer 22. The connecting terminal 19 that is a part of the lower conductive layer, can be electrically connected to an upper conductive layer's pattern since the upper layer part 20a and the lower layer part 20b are electrically connected to each other. The second embodiment shows a two-layer structure having the two parts 20a and 20b. However, the present invention can be employed to a multi-layer structure such as a three or more layer structure.

The above-described embodiments disclose the head portion in the plan shape of a square. However, other shapes such as rectangles, polygons such as pentagons and hexagons and circles, if necessary, may be employed. Also, the above embodiments show the structure designed with a one micron design rule, however, the structure of the present invention may be designed with any of various other design rules. As described above, the present invention enables a structure designed with a predetermined design rule, to be used for a finer design rule by providing a terminal of the structure with a head portion to increase the contact area between the terminal and a conductive pattern to be formed on a grid of the screen of the automatic conductive pattern a layout machine. It makes a library of the structures more flexible and more efficient in layout design process.

What is claimed is:

1. A library including a plurality of structures designed with a preset design rule, the library used to electrically connect to conductive patterns of the preset design rule, the library comprising:

a main part including one or more circuit elements;

a connecting terminal connected to said main part, said connecting terminal having a width that is less than a minimum space between the conductive patterns; and a head portion connected to said connecting terminal at an end thereof, a width of said head portion being greater than the minimum space between the conductive patterns.

2. A library according to claim 1, wherein said head portion has widths in X and Y directions, said head portions widths being greater than the minimum space between the conductive patterns both in the X and the Y direction.

3. A library according to claim 1, wherein the width of said head portion is greater than the sum of the minimum space between the conductive patterns and a minimum conductive pattern width of the design rule.

4. A library according to claim 1, wherein said head portion has a square shape.

5. A library according to claim 1, wherein said head portion is a first head portion, further comprising a second head portion formed of a conductive layer in a plane different than a plane of said connecting terminal, the second head portion having a width greater than the minimum space between the conductive patterns of the design rule, the second head portion being electrically connected to said first head portion.

6. A library according to claim 1, wherein the width of said connecting terminal is substantially equal to a minimum conductive pattern width of the design rule.

7. A library including an plurality of structures, comprising:

a main part including one or more circuit elements designed with a first design rule;

a connecting terminal designed with the first design rule, connected to said main part, said connecting terminal having a minimum pattern width of the first design rule; and a head portion designed with the first design rule, connected to said connecting terminal at an end thereof, a width of said head portion being greater than the minimum pattern width of the first design rule, wherein the library is used to electrically connect to a conductive pattern, the conductive pattern designed with a second design rule smaller than the first design rule, the conductive pattern being electrically connected to said head portion.

8. A library according to claim 7, wherein the conductive pattern of the first design rule comprises a plurality of conductive patterns, and wherein the width of said head portion is greater than a minimum space between the conductive patterns in both the X direction and the Y direction.

9. A library according to claim 7, wherein the conductive pattern of the first design rule comprises a plurality of conductive patterns, and wherein the width of said head portion is greater than the sum of a minimum space between the conductive patterns and the minimum conductive pattern width of the first design rule.

10. A library according to claim 7, wherein said head portion has a square shape.

11. A library according to claim 7, wherein said head portion is a first head portion, further comprising a second head portion formed of a conductive layer external to said connecting terminal, the second head portion having a width greater than the minimum pattern width of the first design rule, the second head portion being electrically connected to the first head portion.

12. A semiconductor circuit pattern designed with different design rules, comprising:

a main circuit pattern designed with a first design rule;

first conductive patterns designed with the first design rule, each including a lead portion connected to said main circuit pattern, said first conductive patterns having a first width, and a head portion connected to said lead portion at an end thereof, a width of said head portion being greater than the first width; and second conductive patterns designed with a second design rule smaller than or equal to the first design rule, each said second conductive pattern having a second width which is smaller than the first width, said second conductive patterns being electrically connected to the head portions of said first conductive patterns.

13. A semiconductor circuit pattern according to claim 12, wherein the first width is smaller than a minimum space between the conductive patterns of the first design rule.

14. A semiconductor circuit pattern according to claim 12, wherein the first width is substantially equal to a minimum pattern width of the first design rule.

15. A semiconductor circuit pattern according to claim 12, wherein the second width is smaller than a minimum space between the conductive patterns of the second design rule.

16. A semiconductor circuit pattern according to claim 12, wherein the second width is substantially equal to a minimum pattern width of the second design rule.

17. A semiconductor circuit pattern according to claim 12, wherein the width of the head portion is greater than a minimum space between the conductive patterns of the first design rule in both the X direction and the Y direction.

18. A semiconductor circuit pattern according to claim 12, wherein the width of said head portion is greater than a total of a minimum space between the conductive patterns and a minimum pattern width of the first design rule.

19. A semiconductor circuit pattern according to claim 12, wherein said head portion has a rectangular shape.

20. A semiconductor circuit pattern according to claim 12, wherein the head portions of the first conductive patterns are first head portions, further comprising conductive layers spaced from said first conductive patterns in a direction perpendicular thereto, the conductive layers including second head portions each having a width greater than a minimum pattern width of the first design rule, the second head portions being electrically connected to the first head portions.

* * * * *